United States Patent
Grund (10) Patent No.: US 7,560,948 B2
(45) Date of Patent: Jul. 14, 2009

(54) CIRCUIT FOR MINIMIZING OR ELIMINATING PULSE ANOMALIES IN HUMAN BODY MODEL ELECTROSTATIC DISCHARGE TESTS

(75) Inventor: Evan Grund, San Jose, CA (US)

(73) Assignee: Thermo Keytek LLC, Fremont, CA (US)

( * ) Notice: Subject to any disclaimer, the term of this patent is extended or adjusted under 35 U.S.C. 154(b) by 0 days.

(21) Appl. No.: 11/652,869

(22) Filed: Jan. 11, 2007

(65) Prior Publication Data

US 2007/0159205 A1 Jul. 12, 2007

Related U.S. Application Data

(60) Provisional application No. 60/757,932, filed on Jan. 11, 2006.

(51) Int. Cl.
*G01R 31/26* (2006.01)
*G01R 29/12* (2006.01)
*G01N 27/60* (2006.01)
*H02H 9/00* (2006.01)
*H02H 3/22* (2006.01)

(52) U.S. Cl. ............ 324/765; 324/452; 324/457; 361/56; 361/111

(58) Field of Classification Search ............ 324/452, 324/457, 765; 361/56, 111
See application file for complete search history.

(56) References Cited

U.S. PATENT DOCUMENTS

| 4,636,724 | A | * | 1/1987 | Fukuda et al. | ............ 324/527 |
| 5,519,327 | A | | 5/1996 | Consiglio | |
| 5,523,699 | A | * | 6/1996 | Miyagawa | ............ 324/765 |
| 5,804,977 | A | | 9/1998 | Consiglio | |
| 6,108,181 | A | * | 8/2000 | Gerosa | ............ 361/56 |
| 6,429,674 | B1 | | 8/2002 | Barth et al. | |
| 7,119,597 | B1 | * | 10/2006 | Barrett et al. | ............ 327/291 |

OTHER PUBLICATIONS

Grund, A wafer level HBM tester delivering pulses with variable risetime through transmission lines, 2003, ESD Association.*
Military Specifications, MIL-883E-Method, Electrostatic Discharge Sensitivity Classification, 6 pages, Mar. 22, 1989.
Automotive Electronics Council, AEC-Q101-REV-B, Stress Test Qualification for Discrete Semiconductors, 68 pages, Jul. 25, 2000.

(Continued)

*Primary Examiner*—Ha Tran T Nguyen
*Assistant Examiner*—Karen M Kusumakar
(74) *Attorney, Agent, or Firm*—Nixon Peabody LLP (57) ABSTRACT

A new circuit for producing simulated electrostatic discharges (ESD) based on the Human Body Model (HBM) is disclosed for testing integrated circuits. HBM ESD test systems provide stress pulses defined by industry standards. The pulses produced by prior art have small imperfections or anomalies. These anomalies can cause incorrect testing to certain devices. The improved ESD HBM test system herein disclosed provides pulses meeting the requirements of industry standards while reducing several anomalies to negligible levels.

9 Claims, 4 Drawing Sheets

OTHER PUBLICATIONS

Electrostatic Discharge (ESD) Association, ANSI/ESD STM5.1-2001, Human Body Model (HBM) Component Level, 17 pages, Mar. 20, 2003.

ESD Association, ANSI/ESD STM5-5.1-2008, Electrostatic Discharge Sensitivity Testing—Transmission Line Pulse (TLP)—Component Level, 25 pages, May 19, 2008.

Jeita, EIAJ ED-4701/300, Environmental and endurance test methods for semiconductor devices, 98 pages, Aug. 2001.

Jedec Standard, Electrostatic Discharge (ESD) Sensitivity Testing Human Body Model (HBM), JESD22-A114C.01, 20 pages, Mar. 2005.

Gund, Evan, A Wafer Level HBM Tester Delivering Pulses with Variable Risetime through Transmission Lines, Proc. EOS/ESD Symposium, 7 pages, 2003.

Gund, Evan, et al., Methods to Remove Anomalies from Human Body Model Pulse Generators, Proc. EOS/ESD Symposium, 8 pages, 2006.

* cited by examiner

Fig.1
Prior Art HBM Circuit

Fig. 2
Prior Art HBM Pulse Anomalies

CIRCUIT FOR MINIMIZING OR ELIMINATING PULSE ANOMALIES IN HUMAN BODY MODEL ELECTROSTATIC DISCHARGE TESTS

CROSS REFERENCE TO RELATED APPLICATION

This application claims the benefit of U.S. Provisional Application No. 60/757,932, filed Jan. 11, 2006, which is incorporated herein by reference.

BACKGROUND OF THE INVENTION

1. Field of the Invention

This invention relates generally to testing systems of integrated circuits (ICs) and in particular to testing of ICs for electrostatic discharge (ESD) sensitivity based on the industry standard Human Body Model (HBM) test pulse waveform.

2. Description of the Related Art

Testing of ICs for ESD sensitivity involves simulating a discharge from a human hand. Standard stress pulses are specified by various standards bodies in their specifications, including Military Specifications {MIL-883E-Method 3015.7}, JEDEC/Electronics Industries Association {EIA/JESD 22-114C}, Electrostatic Discharge Assoc. {ESDA/ANSI STM 5.1-HBM, 2001}, Automotive Electronics Council {AEC-Q101-001, Rev-B, July 2000}, and Japan Electronics and Information Technology Industries Association {EIAJ ED4701/300 Method 304}. All these industry specifications describe a common typical pulse generation circuit for human body model (HBM) testing which is well known to those familiar with the HBM testing art.

The industry standards describe a typical pulse generation circuit as being an energy storage capacitor that is charged to a high voltage and then discharged into the DUT through a fixed resistance. A relay switch controls the charging and discharging of this energy storage capacitor. The non-ideal characteristics of this relay are the source of several undesired anomalies in the HBM pulse. What is needed is an HBM pulse generating circuit whereby these non-ideal characteristics of the relay switch are mitigated or have no effect on the pulse produced.

More specifically, recent technological advances in integrated circuit designs have produced ICs that are more sensitive to small anomalies in the pulses commonly produced by these typical pulse generation circuits as documented in several research papers in 2004 and 2005. The non-ideal pulse properties include: a) a pulse coupled by the relay switch during charging of the storage capacitor; b) pre-pulse ringing from the relays coil when activated; c) a voltage ramp before pulse front edge due to relay switch motion; d) secondary or spurious after-pulses; e) a current leakage post-pulse; and f) relay switching noise. These pulse anomalies can produce stresses and cause IC damage, resulting in performance degradation or failure. For some ICs, such tester anomaly damage may be confused with ESD damage and therefore impair the proper ESD testing of ICs. Industry standards are being updated to include limits on these pulse anomalies, e.g., JEDEC EIA/JESD 22-114C. Therefore, a need exits in the art of ESD test systems for a tester that eliminates or reduces to negligible levels undesired anomalies in the test pulses being produced.

When stress pulses are applied to an IC, a residual amount of electrical charge that was forced through the IC may remain stored inside the IC. Such remaining charge may adversely affect subsequent testing. The industry standards often specify the addition of a second relay switch to a pulser circuit to provide an electrical path for removing residual charge after each stress pulse application. Such a second relay switch can produce additional unwanted stress to the IC since operation of the switch may cause a sudden removal of the stored charge, resulting in a high current pulse. Prior art ESD testers have added current limiting resistors to address this problem. A need exists to prevent discharge relay inducted stress while not distorting the HBM test pulse.

Figure 1:
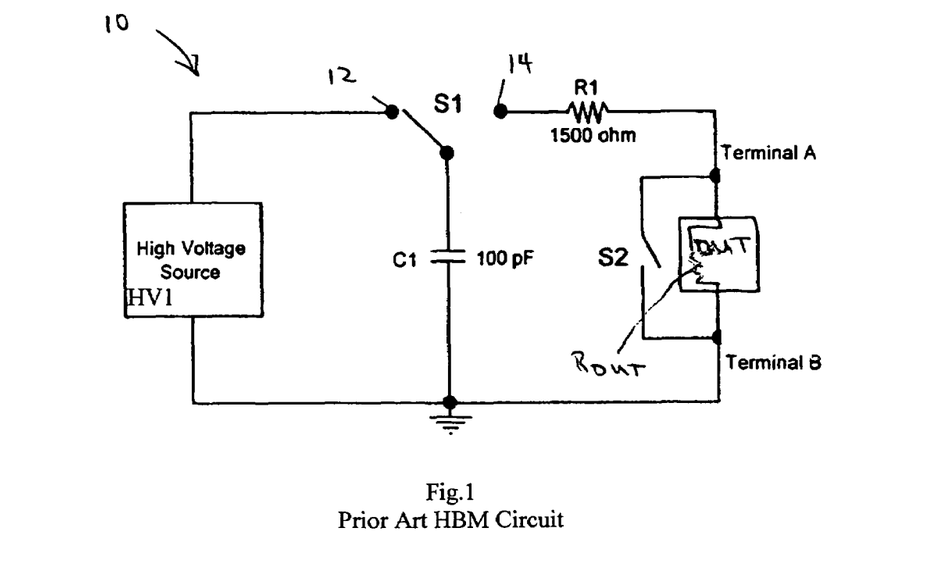
FIG. 1 is a schematic diagram of a prior art HBM test device of the type specified by various industry standards groups.

FIG. 1 is a schematic diagram of an exemplary prior art HBM electrostatic discharge test device 10 for testing the response of a device under test (DUT). A relay switch S1 operates to first couple a high voltage source HV1 to an energy storage capacitor C1 and then, once capacitor C1 is charged, switch S1 decouples it from HV1 and couples C1 to the DUT through a series connected resistor R1. The power supply HV1 charges the capacitor C1 to the desired high voltage, Vo, when the relay switch S1 is in the deactivated state, as illustrated. The power supply HV1 may have a high impedance output (1 M$\Omega$ or more) or may include a series resistor to limit the charging rate of C1. When switch S1 is activated, capacitor C1 is connected to the series connection of R1 and terminal A of the DUT and the HBM test pulse is generated. The peak current of the HBM pulse applied to the DUT is approximately Vo/(R1+$R_{DUT}$), where Vo is the initial voltage and R1 is approximately 1500 ohms. $R_{DUT}$ is the effective resistance of the DUT between terminals A and B. The current pulse portion of the HBM pulse exponentially decays to zero with a time constant of C1·(R1+$R_{DUT}$). After the HBM pulse has fully decayed to zero, switch S1 is deactivated and a relay switch S2, connected across the DUT between terminals A and B, is activated. Switch S2 provides a discharge path for any residual charge that may be stored by the DUT. It is common practice to add a resistor R2, having a resistance of between 10K and 10M ohms, in series with S2 to limit the DUT discharge current as required by some industry standards. When switch S1 is returned to its initial deactivated position, capacitor C1 will again be recharged by HV1. Switch S2 is opened at some point before the next HBM test pulse is generated.

Switch S1 is typically implemented with mercury wetted contacts held in a glass envelope containing a high-pressure inert gas and activated by a coil of wire surrounding the envelope. When switch S1 is activated by applying current to the relay coil, the armature that provides the "common" relay contact moves from the "normally closed" relay contact 12 to the "normally open" contact 14 under the electromagnetic force from the coil. The anomalies associated with the operation of this relay include those specified as a)-e) above. One or more other relay switches are often also used in prior art HBM test devices to conduct the HBM pulse to the IC (DUT) and/or to provide one or more paths to ground to complete the pulse conduction path, and these additional relay switches can also induce noise when they switch.

Figure 2:
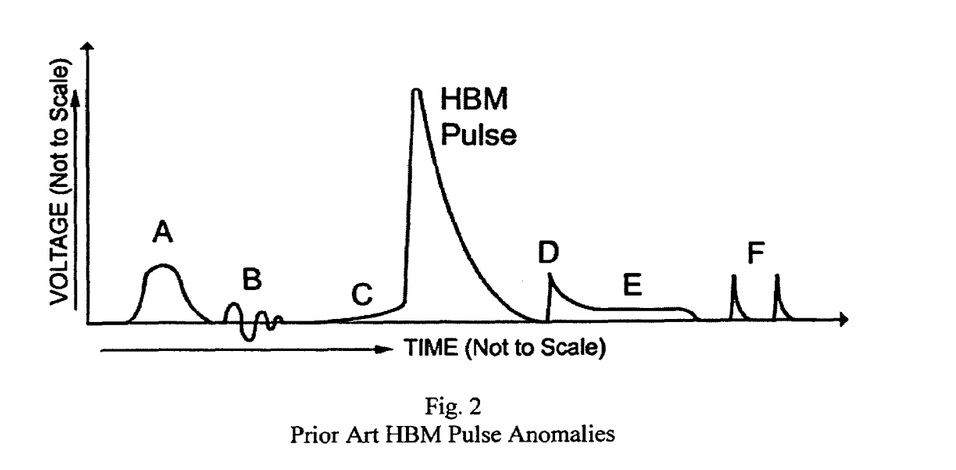
FIG. 2 is a waveform diagram that illustrates exemplary pulse anomalies generated by prior art HBM test devices.

FIG. 2 is a waveform diagram that illustrates exemplary anomalies generated by prior art HBM pulse test devices. With regard to anomaly a), a spurious pulse may be generated when the aforementioned relay switch connects the high voltage supply to the storage capacitor to charge this capacitor, and such a pulse is shown at A in FIG. 2. While the voltage across capacitor C1 increases from zero to the level of the high voltage supply voltage, the small parasitic capacitance formed by the relay contacts will couple this voltage ramp to the DUT. Because the high voltage supply typically provides thousands of volts, only a few picofarads of parasitic relay capacitance can produce voltages at the DUT that can exceed the DUT's normal operating voltage. What is needed is a circuit that removes or eliminates charging pulse anomalies that are generated in this fashion.

Pre-pulse ringing noise, anomaly b), is shown at B in FIG. 2, and is due to coupling of an electric field from the relay coil to the relay's internal metal contacts when voltage is applied to the relay coil. This pre-pulse noise occurs when the relay coil current begins to flow through the relay coil before the movable metal reed armature of the relay switch has time to move. Pre-pulse ringing noise is typically an oscillating voltage pulse that precedes the HBM pulse by the amount of time required for the relay's contacts to move from their deactivated position to where the relay switch conducts the HBM pulse current from capacitor C1 to the DUT. This time duration is typically of the order of several milliseconds. The addition of electrostatic shielding to the relay can reduce the coupling of the electric field from the relay coil to the relay contacts with little attenuation of the needed magnetic force, as is well-known to those trained in relay art.

A voltage ramp immediately before the HBM pulse, anomaly c), is shown at C in FIG. 2. This anomaly is produced by the change in parasitic capacitance between the relay switch contacts as the metal reed armature moves. Because the capacitance between two metal electrodes increases when the distance between the metal electrodes decreases, as the armature contact reed moves away from the normally closed contact toward the normally open contact, the capacitance between the common and normally open contacts increases. Capacitance is measured as the amount of electrical charge stored in a capacitor divided by the voltage across the capacitor; $C=Q/V$. Current through a capacitor is the change in charge stored with respect to time, $$i(t) = \frac{dQ}{dt} = \frac{d(C \cdot V)}{dt} = V \frac{dC}{dt},$$

with the voltage V across the relay switch being approximately constant while the armature moves. The current produced by the relay armature motion is conducted to the DUT by resistor R1 in the prior art circuit of FIG. 1. This current flowing into the DUT can raise the voltage at DUT terminal A even more if the DUT has low capacitance and low leakage, as is common with many IC input terminals. The capacitance between the armature contact and the normally open contact, which is connected to the DUT, continues to increase as the contacts move closer, producing increasing current until the electric field between the armature common contact and the normally open contact reaches the breakdown voltage potential of the inert gas in the glass envelope of the relay. A voltage ramp with an exponentially increasing shape is produced just before the spark/arc discharge occurs that conducts the HBM pulse current from capacitor C1 to the DUT. This pre-pulse voltage ramp can be reduced by selecting a relay switch with small switch contact areas, but that may limit peak currents and shorten the switch's working life.

The secondary or spurious after-pulse(s), anomaly d), is shown at D in FIG. 2, are caused by small discharges occurring after the main discharge of storage capacitor C1, such as when the relay fully closes and makes metal-to-metal contact. In other words, if the capacitor C1 in FIG. 1 is not fully discharged during the HBM pulse from the initial spark discharge, as described above, the remaining energy will be discharged when the armature common connection of S1 makes physical contact to the normally open relay terminal 14. A full discharge of C1 during the HBM pulse does not usually occur. During the spark discharge generated pulse time, the HBM pulse current exponentially decays, with a time constant of approximately 150 nanoseconds. This time constant is controlled by the product of the capacitance of C1 and resistance of R1 plus the DUT impedance. When the current is sufficiently low, the electron avalanche in the high pressure gas that sustains the spark or arc inside the relay switch will not be maintained and the spark will extinguish and the current flow will subside with a small voltage remaining across C1. Should the residual voltage across C1 be large enough to cause another spark discharge through the gas of the relay before the armature completes it motion and closes against the normally open relay terminal, a secondary spurious after-pulse is produced. When the relay switch completes its motion and connects its common terminal to its normally open terminal 14, the residual charge in C1 will be discharged into the DUT. In some relay switches, many spurious pulses can be produced after the main HBM pulse has been generated. Secondary pulses of 10 to 15% of the magnitude of the first HBM pulse are common during operation of the prior art circuit of FIG. 1. What is needed is a circuit that does not generate such multiple secondary pulses.

After an HBM pulse is generated by the spark or arc discharge residual ionization of the gas inside the relay will cause another anomaly, anomaly e) as shown at E in FIG. 2. This ionization typically lasts for hundreds of microseconds, during which time current from the high voltage supply is conducted to the DUT, limited by the impedance of R1 plus the output impedance of the high voltage supply, which is typically 10 megohms in the prior art circuit of FIG. 1. As some DUTs have very high input impedance, leakage of only microamperes can produce a slow ramp to very high voltages, thereby causing gate oxide stress and failures in the ICs under test. What is needed is a means for eliminating this post-pulse current leakage.

HBM testers are implemented to connect and deliver the HBM pulse to any pin on the IC package under test. A requirement of industry standards is also the ability to connect a prescribed number of other IC package pins to a ground return path. The requirements to make a sequence of various connections may be realized by a set of relay switches. The activation and switching of such relay switches can produce noise spikes, anomaly f), as shown at F in FIG. 2. Industry standards specify the inclusion of a series current limiting resistor of value between 10K and 10M ohms to be placed in series with the relay switch S2 of FIG. 1. This prior art prevents a high current discharge of the IC being tested, but it does not prevent relay noise pulses. What is needed is a circuit that isolates the DUT from such relay switch noise spikes.

Practical testers must provide the HBM pulse to various terminals of DUT. Therefore, wiring paths may be constructed to meet specific testing needs and modified by inclusion of relays to configure a pulse delivery path as desired under computer control. It is common in prior art test devices to have several relay switches, or a matrix of relay switches, between R1 and the DUT connections, thus allowing the HBM pulse to be applied to different pins of the DUT. Prior art testers are limited to some extent by the added stray capacitance generated by such a matrix of relay switches. The industry standards require testing with a 500-ohm load to detect excessive stray capacitance between the pulser and the DUT.

The HBM pulse is specified by industry standards to have a rise time from 2 to 10 nanoseconds, followed by an exponentially decay with a time constant of 150 or more nanoseconds. Some ICs have rise time sensitive trigger circuitry to detect such fast pulses and activate ESD protection devices.

These ICs can produce different test results when tested with HBM pulses of differing rise times. In prior art HBM test devices, the rise time was determined by parasitic inductances and capacitances in the wiring from pulser to DUT that could not be specified nor changed. This limits the utility of such prior art circuits.

In addition, when an IC or other device being tested is damaged, or "fails", under the application of an ESD stress pulse, it is often desirable to fully characterize the stress that induced failure. The information provided in prior art ESD HBM testers is only the voltage of the pulse that induced failure. A more complete characterization, valuable to IC design engineers, also includes the current of the pulse applied to the IC as a function of time. From these voltage and current pulse waveforms, which change during the time the pulse is applied to the IC, the actual power delivered to the IC can be calculated. Therefore, a need also exits in the art of ESD test systems for a tester that measures the voltage and current stresses applied to the IC.

SUMMARY OF THE INVENTION

Accordingly, it is an object of the present invention to provide an improved HBM system for testing integrated circuits, especially for the electrostatic discharge (ESD) protection evaluation of such electronic parts. This invention is a modified HBM test device that produces the desired HBM pulses without unwanted pulse distortions. The improved HBM test device eliminates the creation of charging pulse anomalies. A further improvement is the removal of residual charge from the device under test after each stress pulse without the use of a mechanical relay switch. A further improvement is the ability to adjust the rise time of the HBM pulse over the range of 2 to 10 nanoseconds, the range of rise times allowed by the referenced standards. A further improvement is the ability to monitor current flowing through the device under test (DUT) during the HBM pulse. A further improvement is the ability to measure the voltage across the DUT during the HBM pulse in a manner that doesn't effect the pulse meeting the required standard specifications.

Broadly stated, the present invention is a human body model electrostatic discharge test device for testing the response of a device under test (DUT) to a high voltage test pulse, said DUT having a first terminal to be tested and a second terminal connected to a ground return path, said test device comprising a voltage source for generating a predetermined high voltage at an output terminal with respect to ground, a switch coupled to said output terminal, a series combination of a capacitor and a resistor having a first terminal coupled to said switch and a second terminal coupled to said first terminal of said DUT, a first circuit for selectively closing said switch to cause the high voltage on said output terminal to be coupled to said series combination of a capacitor and a resistor, to cause said capacitor to charge and to cause the charging current to pass through the DUT, and a second circuit for selectively discharging said capacitor after said switch is opened.

More specifically regarding anomaly b) pre-pulse ringing, for HBM pulse relay switches, the electric field coupling can be reduced according to the present invention by removing the glass envelope from the center of the coil and placing it outside the coil and adding magnetic pole pieces from the coil to conduct the magnetic field to the metal reed inside the envelope. The moving armature reed with a relatively large cross-section of contact should be connected toward the high voltage supply so that the majority of the induced ringing current is directed into the supply and not to the DUT. The capacitance of wiring and the use of low pass filters between the relay switch and the DUT, as described herein, further reduce the pre-pulse ringing. Ringing levels of less than 50 millivolts at the DUT, a negligible level, can be achieved by the preferred embodiment of an HBM test device according to the present invention. More specifically, the pre-pulse current i(t) is not directly applied to the DUT, but to a capacitor that blocks these low frequency currents from reaching the DUT. This provides a large reduction of the voltage induced by the changing capacitance. The new circuit also has either a second switch, shown at S2 in FIG. 3, or a resistor shown at R2 in FIG. 3a, which drains off the induced current thereby further reducing the pre-pulse voltage.

The test device according to the present invention also greatly reduces the generation of anomaly d) secondary pulses. During the HBM pulse produced by spark discharge in the relay switch according to the present invention, the voltage at the input terminal of C1 is brought to the high voltage supply voltage. In this circuit, a much higher current is passed through relay switch S1 than the current through the similar switch S1 of FIG. 1, as R1 no longer functions to limit this current. In addition, this current flows for a shorter time without an exponential decay. This more intense spark has lower impedance and allows the current from the high voltage supply to bring the storage capacitor C1 from zero volts to the power supply voltage during the time the HBM test pulse is being generated. Subsequently, there is little voltage across the relay switch contacts when the armature completes its motion, which greatly reduces the generation of any secondary pulse.

Figure 3:
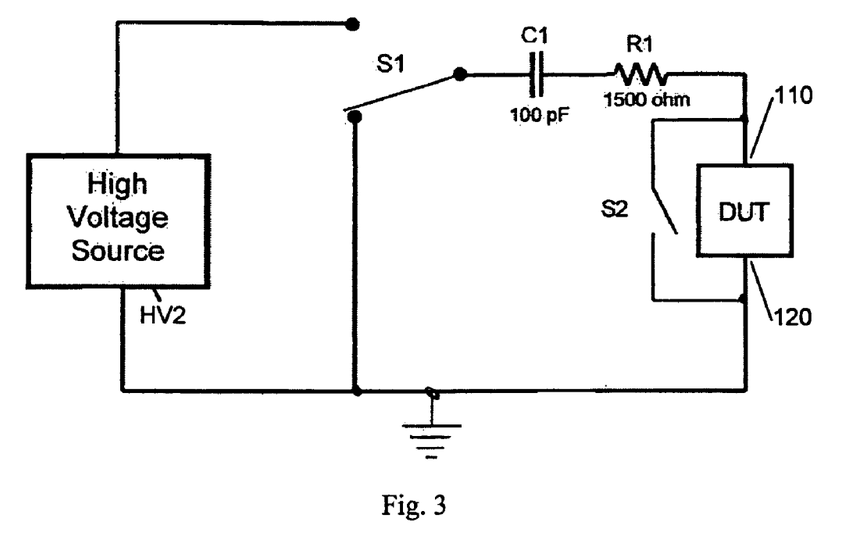
FIG. 3 is a schematic diagram of an HBM test device according to the present invention wherein a second switch drains off the induced current in the DUT.

The anomaly e) leakage current is stopped in test device according to the present invention because storage capacitor C1 in the inventive circuit shown in FIG. 3 blocks the current flow, since a quality high voltage capacitor allows an extremely low amount of leakage current to be coupled therethrough.

It is a purpose of the present invention to isolate the IC under test from relay switch noise spikes, and thereby minimize anomaly f) waveforms, by providing a very low impedance path in parallel to divert all noise pulses during the period when relays are switched.

The present invention provides a two stage discharge of the IC under test with use of a resistor of between 10K and 10M ohms resistance permanently connected to the IC. The resistor will discharge the IC immediately after the end of the HBM pulse without generating any switching noise from S2 and without diverting excessive current from passing through the IC, so as to not meet industry standard requirements for current waveforms. After the discharge resistor has discharged the IC, a new S2 relay is preferably connected across the IC pins to provide a very low impedance path for subsequence noise currents thereby isolating the IC from various noise sources including the anomalies previously identified.

Figure 4:
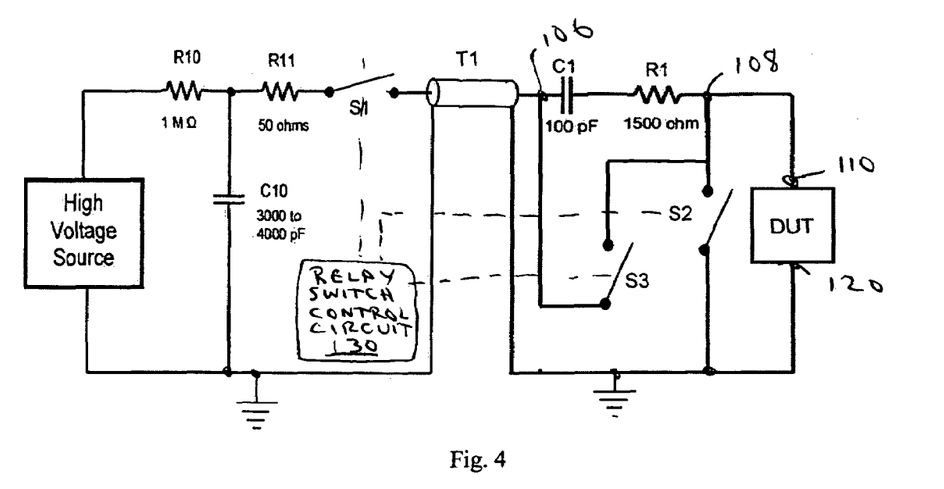
FIG. 4 is a circuit diagram of a second embodiment of an HBM test device according to the present invention.

Regarding the HBM pulse rise time, it is a purpose of present invention to allow specific rise times to be produced and furthermore to allow the rise time to be changed. A low pass filter is preferably added to the pulser to provide a predetermined pulse rise time. Such a filter can be a resistor-capacitor circuit for filters designed to be used with controlled impedance cables. For compatibility with filters and for convenience of construction, the new tester may employ an impedance controlled cable inserted between S1 and C1 as shown in FIG. 4. The fast rise times of the pulse will not be sacrificed if the connection between S1 and C1 is made with wiring that has constant impedance that may match the impedance of the high voltage source. This constant impedance wiring may be any combination of controlled impedance transmission means such as, but not limited to, coaxial cables, twisted wire pairs, printed wiring boards with microstrip or stripline construction or constant impedance relays. Rise time can also be maintained through a signal path comprised of a sequence of different transmission wiring means if they have a common controlled impedance. A low pass filter can be inserted into the path between S1 and C1 will remove high frequencies thereby increasing the rise time. Using a constant impedance conduction path between S1 and C1 allows the inclusion of an impedance matched low pass filter, which can be changed to effect control of the rise time of the pulse reaching C1. The preferred type of filter is an absorptive semi-Gaussian due to its smooth response to a step input, and it requires constant impedance at its input and output which can be supplied with the controlled impedance transmission path. It is a purpose of this invention to allow a specific rise time, or a set of rise times, to be generated.

According to the present invention the problem of added stray capacitance generated by a matrix of relay switches is minimized, since the inventive test device allows such a matrix of switches to be positioned between S1 and C1, as seen in FIG. 4, so that a multiplicity of C1-R1 networks can be used to increase the number of pins of the DUT to which an HBM pulse can be applied. For the circuit of this invention, therefore, the stray capacitance limit imposed by the standards applies only to the stray capacitance of the added switches. Furthermore, relay switching can be used on both sides of the C1-R1 networks for maximum distribution of pulses.

In HBM testers it is necessary to determine when a DUT has been damaged by HBM pulses. A circuit is therefore provided for connecting a source-meter unit (SMU) or other parametric analyzer to the DUT. The SMU is used to determine changes in DUT electrical properties by providing a preset voltage or set of voltages and measuring leakage currents of the DUT terminal receiving the HBM. It is common to test DUT condition between each HBM pulse. Therefore the preferred embodiment of this invention includes means to connect a SMU or similar test equipment to the DUT.

These and other objects, features and advantages of the present invention will no doubt become apparent to those skilled in the art after reading the following detailed description of the preferred embodiments that are illustrated in the several accompanying drawings.

BRIEF DESCRIPTION OF THE DRAWINGS

The present invention can be better understood with reference to the accompanying drawings, which are incorporated in and form a part of this specification, and, together with the description, serve to explain the principles of the present invention.

DETAILED DESCRIPTION OF THE PREFERRED EMBODIMENTS

In the following description, numerous specific details are provided, such as the identification of various system components, to provide a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 3 is a schematic diagram of an HBM test device according to the present invention. The test circuit shown in FIG. 3 starts with a capacitor C1 that is in a discharged state. When relay switch S1 connects the high voltage supply HV2 to C1. The high voltage supply HV2 should have a low output impedance compared to 50 ohms. When HV2 is connected to C1 via switch S1, a voltage step is applied to C1 which brings both terminals of C1 to the voltage of the high voltage supply. This high voltage is consequently applied to the series combination of R1 and a terminal 110 of the DUT, to begin the HBM pulse. As current flows through R1 and the DUT, the HBM pulse will decay and C1 is charged. In the circuit shown in FIG. 3, the peak pulse amplitude and pulse decay time is the same as the circuit of FIG. 1. Hence, the HBM pulses generated by the invented circuit are the same as prior art circuits, but the circuit in FIG. 3 reduces or removes the anomalies shown in FIG. 2, described above. Capacitor C1 as shown in FIG. 3 becomes fully charged during the HBM pulse and therefore must be discharged before the next HBM pulse, and that discharge should not introduce new anomalies. This can be done by simply opening switch S1 to couple capacitor C1 to the ground return path shown. However, this causes the discharge current to also pass through the DUT. Consequently, in the preferred embodiment, a second switch S2 is added to bypass the DUT when the capacitor C1 is being discharged. Preferably, switch S2 is connected across the DUT between terminal 110 and a second ground return terminal 120 of the DUT. Thus, when discharging of capacitor C1 is to take place, switch S2 is first closed and then switch S1 de-energized. As a result, when switch S1 connects capacitor C1 to ground, C1 will be discharged by current through switches S1 and S2 and resistor R1. Resistor R1 functions to limit the discharge current.

Figure 3A:
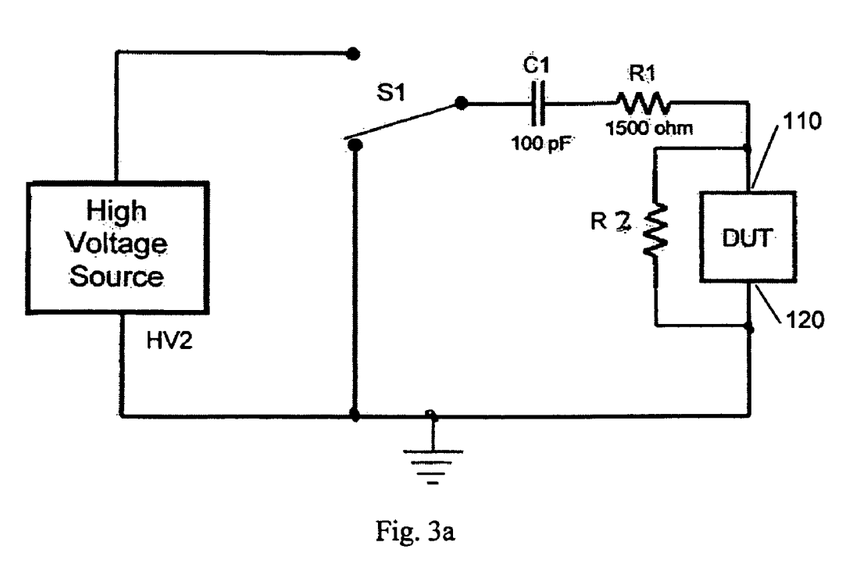
FIG. 3a is a schematic diagram of an alternate embodiment of the HBM test device shown in FIG. 3 where a resistor is used in place of a second switch to drain off the induced current in the DUT.

FIG. 3a is a schematic diagram of an alternate embodiment of the HBM test device shown in FIG. 3 where a resistor R2 is used in place of a second switch to drain off the induced current in the DUT. A drawback of using resistor R2 instead of switch S2 is that the resistor will not prevent some capacitor discharge current from passing through the DUT during the discharging of capacitor C1.

FIG. 4 is a circuit diagram of another embodiment of an HBM test device according to the present invention. FIG. 4 adds two additional switched S2 and S3 to provide further improvements over the prior art. As seen in FIG. 4, a resistor R10 coupled between the high voltage source HV2 and switch S1. Resistor R10 is a current limiting resistor that is often included in high voltage supplies for safety. In order to provide the high voltage supply with low impedance, a capacitor C10 is coupled across the series combination of the high voltage source HV2 and resistor R10. The value of C10 should be large compared to the combined capacitance of capacitor C1 and the cables and test fixtures, so that the voltage across C10 does not significantly change during the time that the HBM pulse is generated. Resistor R11 and a cable T1 are added in series with switch S1 to allow the pulse to be connected over a distance to the HRM pulse forming network comprising capacitor C1 and resistor R1. The series combination of capacitor C1 and resistor R1 includes a first terminal or node 106 coupled to switch S1, and a second terminal or node 108 coupled to a terminal 110 of the DUT.

In the device of FIG. 4, when resistor R11 equals the cable impedance of T1, which may be 50 ohms or some other convenient impedance, a step pulse going from zero volts to one-half the voltage of the high voltage source HV2 is generated when S1 is closed. With the impedance of the capacitor C1 and resistor R1 network being greater than 1500 ohms, a reflection is generated when the step pulse reaches capacitor C1 that approximately doubles the voltage, thereby delivering approximately the voltage of the high voltage source HV2 to capacitor C1. The doubling of the step pulse voltage at C1 produces a reflection that travels back to switch S1 and is conducted to resistor R11. Since resistor R11 is approximately equal the cable impedance of T1, further reflections are avoided.

Switch S2 in the device of FIG. 4 functions in the same way as switch S2 in the device shown in FIG. 3, to selectively discharge the energy stored in the DUT after the HBM pulse has been generated. As in the device shown in FIG. 3, switch S2 is connected across the DUT at terminals 110 and 120, with the switch preferably being normally in an open state when not energized. A third switch, switch S3, is added to the test device of FIG. 4 to discharge capacitor C1 before the next HBM pulse is generated. Switch S3 is preferably coupled such that a first switch contact of switch S3 is coupled to node 106, the junction between said first switch and said capacitor. A second switch contact of switch S3 is coupled to said first terminal 110 of said DUT. Switch S3 is also preferably normally in an open state when not energized.

In the test device illustrated in FIG. 4, while switch S1 is still closed but after the HBM pulse has been generated, switch S2 is activated/closed to discharge the energy stored in the DUT. While switch S2 is closed, switch S3 is closed to discharge capacitor C1, to bring it back to its initial discharged condition. Switch S2, being a very low resistance when closed, prevents voltage from being applied to the DUT while capacitor C1 is being discharged. After switches S2 and S3 are thereafter opened, the test device is ready to produce the next HBM pulse. A relay switch control circuit 130 of conventional design can be used to generate the control signals to switch switches S1, S2, S3 in the manner as above described.

Figure 5:
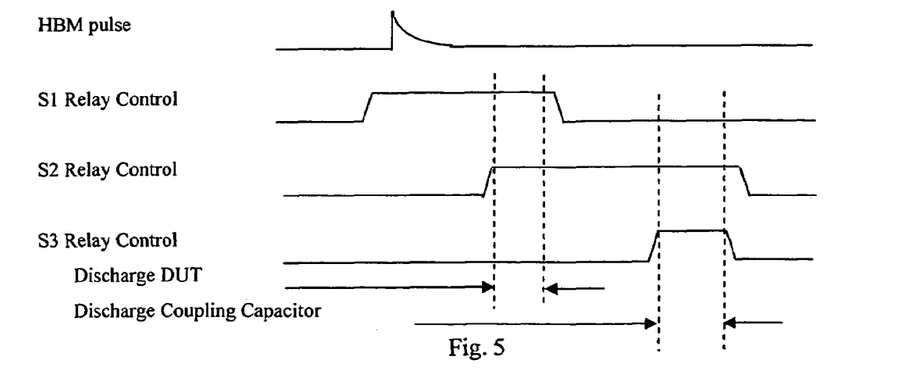
FIG. 5 is a timing diagram showing operation of the relay switches in the circuit shown in FIG. 4.

FIG. 5 is a timing diagram showing operation of the relay switches in the circuit shown in FIG. 4. As seen in FIG. 5, the top waveform represents when the HBM pulse is generated soon after switch S1 is closed, as seen in the second waveform in FIG. 5. Note that the waveforms illustrated in FIG. 5 are not to scale. As also seen in FIG. 5, switch S3 is caused to be closed while switch S2 is closed, to enable the DUT to be discharged. Lastly, switch S3 is closed after S2 is closed but after switch S1 is opened to create a path between capacitor C1 ad the ground return terminal to cause capacitor C1 to discharge without any current passing through the DUT.

Figure 6:
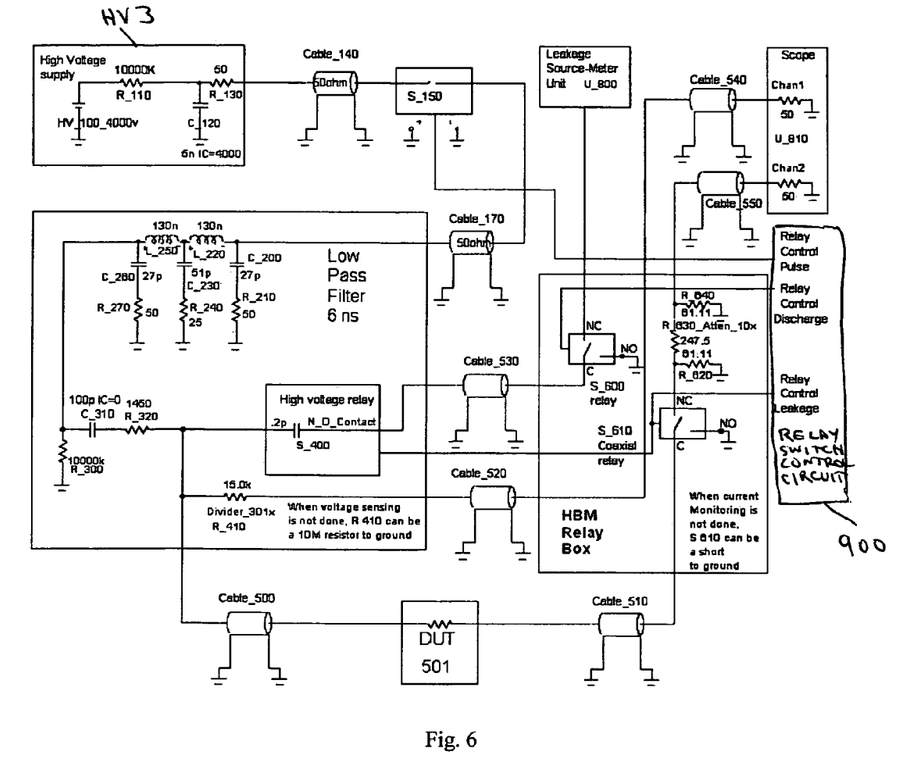
FIG. 6 is a circuit diagram of a preferred embodiment of an HBM test device according to the present invention.

FIG. 6 illustrates a preferred embodiment of an HBM test device according to the present invention. A high voltage supply HV3 provides the HBM stress voltage, which is conducted through the current limiting resistor R110 to the charge storage capacitor C120 which is charged to the desired HBM stress test voltage level. At the same time, the cable 140 to the pulse switch S150 is charged through a resistor R130. Prior to generating the HBM pulse, cable 170 and capacitors 200, 230, and 260 are discharged by a resistor 300. Also, capacitor 310 is discharged through resistor 300 on one side and the path of resistor 300, relay switch 400, cable 530, and relay 600 and the ground path on the other.

When switch 150 is activated by a controller signal "relay control pulse", cable 140, at the HV potential, is connected to cable 170 which is initially at zero voltage. A pulse is launched traveling down cable 170 in a direction away from switch 150 at half the voltage of capacitor 120. The pulse travels through a semi-Gaussian low pass filter composed of capacitors 200, 230 and 260, resistors 210, 240 and 270, and inductors 220 and 250. This filter determines the HBM pulse rise time. The invention is not limited to this type of filter, as with any type of low pass, filter will slow the rise time of the HBM pulse. The inductors and capacitor values can be increased or decreased to increase or decrease the rise time in a manner well known in the art. The preferred rise time is between 2 and 10 nanoseconds, and can be provided by component selection and filter type as is well known in the art. The pulse rising edge raises the voltage of resistor 320 and capacitor 310 (both ends) and a reflection is generated by the impedance mismatch of 50 ohms and the approximately 1500 ohms of the combination of resistor 320 and the parallel combination of cable 500 (typically 50 or 75 ohms) and resistor 410 plus the 50-ohm cable 520. The impedance change makes a reflection that increases the voltage across resistor 300 in an amount approximated by $$V_{INCREASE} = V_{INITIAL} \cdot \frac{Z_2 - Z_1}{Z_2 + Z_1} = V_{INITIAL} \cdot \frac{1500 - 50}{1500 + 50} = 0.9355 \cdot V_{INITIAL}.$$

As the DUT may be of significant impedance the increased voltage may be bigger than described above, i.e., closer to Vinitial. The voltage across resistor 320 is almost doubled by the reflection. The reflected voltage pulse travels back toward the high voltage supply through the filter, cables and switch 150 until it reaches the resistor 130. The far side of the resistor is the low resistance at high frequencies of the storage capacitor 120. Therefore, the impedance seen by the reflected pulse when it reaches resistor 130 is 50 ohms, the same as media transmitting the pulse and there is no impedance mismatch and no further reflections.

During the transit time for the initial pulse to travel from relay 150 to resistor 320 and then for the reflected pulse to travel from 320 back through 150 to resistor 130, the resistor 130 has about half the HV voltage across it and provides current into the signal path from the storage capacitor 120. The charge in capacitor 120 is reduced by this current so its voltage change is $$\Delta Q = C\Delta V = \int I dt = \int \frac{V_{HV}}{2 \cdot 50} dt = \frac{V_{HV}}{100} \cdot T,$$

the round trip pulse transit time. Therefore, $$\Delta V = \frac{V_{HV} \cdot T}{100 \cdot C},$$

the reduction of voltage across capacitor 120. It is desired to have the drop in storage capacitor voltage to equal the loss of voltage in the cable and filter transmission and reflection, thereby providing a perfect voltage match with the voltage of capacitor 120 equaling the voltage of the initial and reflected pulses. This occurs when the voltage of capacitor 120 is reduced about 3% during the pulse round trip transit time. For example, cable 170 and filter wiring may be 3 feet long with a propagation velocity in the cable of 0.66 the speed of light, then the time round trip transit time is 9 nanoseconds.

$$C = \frac{V_{HV} \cdot T}{0.03 \cdot V_{HV} \cdot 100} = \frac{T}{3} = \frac{9 \cdot 10^{-9}}{3} = 3 \cdot 10^{-9} = 3000 \text{ pF}.$$

Longer cables require proportionally larger storage capacitance.

The step pulse front edge with controlled rise time is seen at resistor 300 and capacitor 310. Resistance of resistor 300 is large and has negligible effects in the short time frame of the HBM pulse, and only provides a discharge path to allow capacitor 310 and filter capacitors to be discharged before the pulse. Capacitor 310 and resistor 320 are prescribed in the HBM industry standards to be 100 pF and 1500 ohms to provide the prescribed energy and current for a proper HBM pulse. Cable 500 conducts the pulse to the DUT. It is important to have the total capacitance of cable 500 and stray capacitances to be at most 40 pF to meet the HBM specification requirements. Therefore, it may be preferred to make cable 500 from cable of higher impedance than 50 ohms, such as 75 or 93 ohms, in order to increase cable length for convenience of connection.

The HBM pulse generated passes through the DUT 501 into the ground path provided by cable 510 and 50-ohm signal attenuator composed of resistors 620, 630 and 640, and cable 550 and the 50-ohm input of oscilloscope 810. This is a 50-ohm ground path that allows the oscilloscope 810 to monitor the current through the DUT 501. The voltage at the oscilloscope input is related to DUT current by $$V_{MEASURED} = \frac{I_{DUT}}{500}.$$

The attenuator reduces the signal voltage by a factor of 10 (20 dB) to protect the oscilloscope input from excessive voltage. Resistor 320 is selected to be 1450-ohms rather than the prescribed 1500 ohms to compensate for the 50 ohm ground path, making the effective series resistance of the HBM path equal to 1500 ohms. If DUT current monitoring is not desired, cable 510 can be made very short and connected directly to ground. In this embodiment, the resistance of resistor 320 would need to be increased by 50 ohms.

Resistor 410 is a voltage divider when used with the 50-ohm cable 520 and the 50-ohm oscilloscope 810 input channel 1. The voltage measured at the oscilloscope is related to the DUT voltage by $V_{DUT}=301 \cdot V_{CHANNEL1}-10 \cdot V_{CHANNEL2}$, with arbitrary chosen oscilloscope channel 1 for measuring the DUT voltage and oscilloscope channel 2 for measuring DUT current. If voltage monitoring is not desired, resistor 410 should become a 10 megohm resistor to ground to provide a slow discharge path for capacitor 310.

After each individual or series of HBM stress pulses, a test of the DUT for damage, sometimes called leakage measurement, may be made using parametric analyzers, network analyzers, vector voltmeters, source-meters (SMU) or other diagnostic equipment. To allow connection of such equipment, such as the SMU 800, to the DUT 501, a conduction path exemplified by cables 500, 510 and 530 and relays 400, 600 and 610 is provided. This path connects the SMU to the DUT with a direct ground path return by activation of relays 400 and 610 with relay 600 not activated. Scope inputs should be switched to their high impedance input state during this measurement time to avoid effecting the diagnostic measurement.

Figure 7:
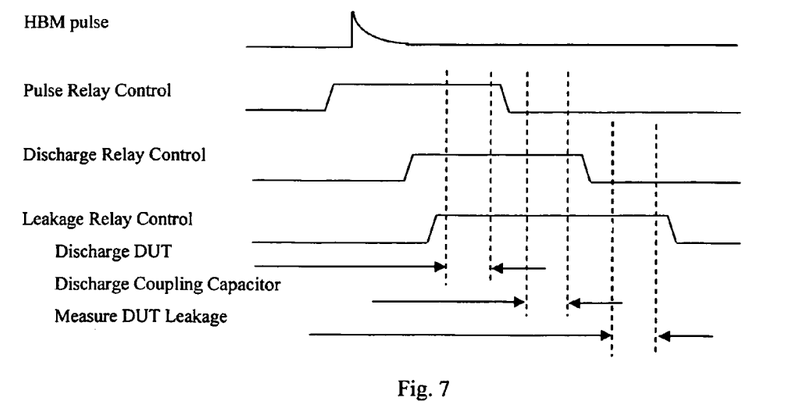
FIG. 7 is a timing diagram showing operation of the relay switches in the circuit shown in FIG. 6.

All of the switches shown in FIG. 6 are controlled in a conventional manner by a relay switch control circuit 900. FIG. 7 shows the preferred way in which the relay switches in FIG. 6 are preferably controlled by circuit 900. The pulse relay 150 is activated to generate the HBM pulse. After the HBM pulse is generated, residual charge is removed without a relay switch through resistor 410. After a delay for the DUT initial discharge, relays 400, 600 and 610 are activated to provide a very low impedance path to fully discharge the DUT and subsequently isolate the DUT from other currents by placing the low impedance path in parallel with the DUT to divert all currents away from the DUT. Then the pulse relay 150 is deactivated and capacitor 310 is discharged without current flowing through the DUT. After the discharge period, the discharge relay 600 is deactivated to connect the SMU, or other diagnostic equipment, to the DUT. After diagnostic measurements are made, leakage measurement relays 400 and 610 are deactivated.

Devices under test are commonly ICs with many pins. A multiplicity of HBM shaping R-C networks, of approximately 1500 ohms and 100 picofarads each, may be used to extend the number of pins of an IC that can be tested. Capacitor 310 and resistor 320 form such an R-C network. Relays on both sides of said shaping networks may be employed to extend the number of pins that an HBM test system can accommodate. Using a multiplicity of R-C networks extends the number of IC pins that can be tested as relays that are not between the shaping networks and the DUT will not add to the 40 pF wiring limit imposed by the 500-ohm load test of the industry standards.

The anomalies common in prior art HBM test systems that are reduced or removed by the present invention should now be understood. Charging of the storage capacitor is made very slowly during each HBM pulse. It is not discharged during each HBM pulse. Therefore, the slow charging reduces the charge transfer through the pulse relay switch's parasitic capacitance. This anomalous current, diagrammed at A in FIG. 2, is also blocked by the pulse shaping capacitor 310 and further reduced by the discharge resistor 300.

Design of the pulse generating relay switch such that its coil is remote from the relay contacts with electrical shielding between the coil and contacts and with magnetic conducting materials to complete a magnetic circuit between the coil and contacts, reduces the relay ringing, diagrammed at B in FIG. 2. According to the present invention, such relay ringing is reduced to negligible levels.

The low frequency ramp immediately before the HBM pulse, as diagrammed at C in FIG. 2, is attenuated by the filtering that the R-C shaping network comprising the approximately 100 pF capacitor and the approximately 1500 ohm resistor, which reduces such low frequencies to negligible levels.

Secondary pulses diagrammed at D in FIG. 2 are produced by the pulse generating relay. In prior art devices, this relay conducts the HBM pulse by an arc discharge and, as the HBM pulse decays, the current level will eventually drop to a level where the arc discharge will not be maintained. When the spark is extinguished, some energy is left in the storage capacitor, and that energy is discharged into the DUT when the relay completes it activation. In the period between the HBM pulse arc discharge and the relay armature completing its motion, residual ionization also partly recharges the storage capacitor as it conducts current from the high voltage supply to the capacitor. While the present invention does not eliminate a secondary pulse, it limits the size of the secondary pulse. The secondary pulse in the inventive device arises from a different mechanism than in prior art devices. The residual ionization that increases secondary pulses in the prior art pulser, reduces the secondary pulse in the new invention by reducing the small voltage across the relay after the arc discharge is extinguished at low current. The secondary pulse is due to a small voltage that may exist across the relay when the contacts close. The pulser according to the present invention will not, however, produce multiple secondary pulses as can occur in the prior art pulser.

The after pulse leakage diagrammed at E in FIG. 2 is eliminated by the DC blocking of the 100 pF capacitor of the R-C shaping network.

Spurious relay switching noise diagrammed at F in FIG. 2 is removed by a relay that is closed that connects the pulsed pin of the DUT directly to ground. With all connected pins of the DUT connected to ground by low impedance paths, all noise currents bypass the DUT and the voltage across the DUT remains zero.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A human body model electrostatic discharge test device for testing the response of a device under test (DUT) to a high voltage test pulse, said DUT having a first terminal to be tested and a second terminal connected to a ground return path, said test device comprising:
    a voltage source for generating a predetermined high voltage at an output terminal with respect to said ground return path;
    a first switch coupled to said output terminal;
    a series combination of a capacitor and a resistor having a first terminal coupled to said switch and a second terminal coupled to said first terminal of said DUT;
    a second switch coupled between said first terminal of said DUT and said second terminal of said DUT;
    a third switch having a first switch contact coupled to said first terminal of said series combination of a capacitor and a resistor and a second switch contact coupled to said first terminal of said DUT; and
    a control circuit for selectively closing said first switch to cause the high voltage on said output terminal to be coupled to said series combination of a capacitor and a resistor, to cause said capacitor to charge and to cause the charging current to pass through the DUT, for causing said second switch to be closed after said HBM pulse has been generated but before said first switch is opened, and for causing said third switch to be closed after said HBM pulse has been generated and during the time that said second switch is closed.

2. The test device of claim 1, wherein said first switch is an electromagnetic relay switch having at least two switch contacts.

3. The test device of claim 1, further comprising a low frequency passing filter inserted between said first switch and said series combination of capacitor and resistor, for producing a pulse rise time in said HBM pulse of between 2 to 10 nanoseconds when said switch is closed.

4. The test device of claim 1, wherein said resistor comprises a first resistor and said capacitor comprises a first capacitor, and wherein said test device further comprises:
    a second capacitor of greater than 1 nanofarad positioned between the output terminal of the high voltage source and ground;
    a controlled impedance cable for connecting said first switch to said series of first capacitor and first resistor; and
    a second resistor coupled in series between the high voltage source and said switch having a resistance approximately equal to said cable impedance.

5. The test device of claim 4, further comprising an impedance matched low frequency passing filter positioned in series with said controlled impedance cable to produce a pulse rise time in said HBM pulse of between 2 and 10 nanoseconds.

6. A human body model electrostatic discharge test device for testing the response of a device under test (DUT) to a high voltage test pulse, said DUT having a first terminal to be tested and a second terminal connected to a ground return path, said test device comprising:
    a voltage source for generating a predetermined high voltage at an output terminal with respect to said ground return path;
    a switch coupled to said output terminal;
    a series combination of a capacitor and a resistor having a first terminal coupled to said switch and a second terminal coupled to said first terminal of said DUT; and
    a control circuit for selectively closing said switch to cause the high voltage on said output terminal to be coupled to said series combination of a capacitor and a resistor, to cause said capacitor to charge and to cause the charging current to pass through the DUT, and for selectively discharging said capacitor after said switch is opened, and
wherein the DUT ground return path comprises:
    an oscilloscope with a 50-ohm input referenced to the circuit ground; and
    a 50-ohm impedance cable connecting said oscilloscope input to DUT ground terminal so that all current flowing through the DUT will pass through the oscilloscope to ground, such that the current through the DUT can be determined by approximately the voltage recorded by the oscilloscope divided by 50.

7. The test device of claim 6 further comprising a 50-ohm impedance matched attenuator into said 50-ohm impedance cable such that the current through the DUT is approximately the voltage recorded by the oscilloscope divided by 50 times the attenuation factor of said attenuator.

8. The test device of claim 1 wherein the DUT ground return path comprises:

an oscilloscope with a 50-ohm input referenced to the circuit ground; and a 50-ohm impedance cable connecting said oscilloscope input to DUT ground terminal so that all current flowing through the DUT will pass through the oscilloscope to ground, such that the current through the DUT can be determined by approximately the voltage recorded by the oscilloscope divided by 50.

9. The test device of claim 8 further comprising a 50-ohm impedance matched attenuator into said 50-ohm impedance cable such that the current through the DUT is approximately the voltage recorded by the oscilloscope divided by 50 times the attenuation factor of said attenuator.

* * * * *